(12) United States Patent
Lung et al.

(10) Patent No.: US 7,701,759 B2
(45) Date of Patent: Apr. 20, 2010

(54) MEMORY CELL DEVICE AND PROGRAMMING METHODS

(75) Inventors: Hsiang-Lan Lung, Elmsford, NY (US); Yi-Chou Chen, San Jose, CA (US)

(73) Assignee: Macronix International Co., Ltd., Hsinchu (TW)

( * ) Notice: Subject to any disclaimer, the term of this patent is extended or adjusted under 35 U.S.C. 154(b) by 307 days.

(21) Appl. No.: 11/777,195

(22) Filed: Jul. 12, 2007

(65) Prior Publication Data

US 2008/0186755 A1 Aug. 7, 2008

Related U.S. Application Data

(60) Provisional application No. 60/888,149, filed on Feb. 5, 2007.

(51) Int. Cl.
*G11C 11/00* (2006.01)
(52) U.S. Cl. .................................. 365/163; 365/148
(58) Field of Classification Search .................. 365/163, 365/148, 189.14
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Hoppe et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |

(Continued)

FOREIGN PATENT DOCUMENTS

CN 1669091 A 9/2005

(Continued)

OTHER PUBLICATIONS

Adler, David, "Amorphous-Semiconductor Devices," Sci. Amer., vol. 236, pp. 36-48, May 1977.

(Continued)

*Primary Examiner*—Vu A Le
(74) *Attorney, Agent, or Firm*—Haynes Beffel & Wolfeld LLP

(57) ABSTRACT

A memory device including a memory cell comprising phase change material is described along with methods for programming the memory device. A method for programming disclosed herein includes determining a data value for the memory cell, and applying a pulse pair to store the data value. The pulse pair includes an initial pulse having a pulse shape adapted to preset the phase change material in the memory cell to a normalizing resistance state, and a subsequent pulse having a pulse shape adapted to set the phase change material from the normalizing resistance state to a resistance corresponding to the determined data value.

14 Claims, 5 Drawing Sheets

U.S. PATENT DOCUMENTS

| | | |
|---|---|---|
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |

| | | | |
|---|---|---|---|
| 2007/0217253 A1* | 9/2007 | Kim et al. | 365/163 |
| 2008/0180990 A1* | 7/2008 | Lung | 365/163 |

FOREIGN PATENT DOCUMENTS

| | | |
|---|---|---|
| WO | WO-00/79539 | 12/2000 |
| WO | WO-01/45108 | 6/2001 |
| WO | WO-2004025659 A1 | 3/2004 |

OTHER PUBLICATIONS

Adler, D. et al., "Threshold Switching in Chalgenid-Glass Thin Films," J. Appl/Phys 51(6), Jun. 1980, pp. 3289-3309.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6, 2009.

Bedeschi, F. et al., "4-Mb MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000 121 pages.

Chen, et al., "Non-Volatile Resistive Switching for Advanced Memory Applications," IEEE IEDM, Dec. 5-7, 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24 μm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, :http://klabs.org/richcontent/MAPLDCon99/Papers/P21_Tyson_P.PDF#search=nonvolatile%20high%20density%20high%20performance%20phase%20change%20memory <http://klabs.org/richcontent/MAPLDCon99/Papers/P21_Tyson_P.PDF#search='nonvolatile% 20high% 20density%20 high%20 performance%20phase%20change%20memory>', 8 pages.

Wolf, Stanley, Excerpt from: Silicon Processing for the VLSI Era-vol. 4, pp. 674-679, 2004.

Wicker, Guy, "A Comprehensive Model of Submicron Chalcogenide Switching Devices," Doctoral Dissertation, Wayne State University, Detroit, MI, 1996.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Chao, D-S. et al., "Low Programming Current Phase Change Memory Cell with Double gst Thermally Confined Structure," VLSI-TSA 2007, International symposium Apr. 23-25, 2007, 2pp.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Optimized Thermal Capacitance in a Phase Change Memory Cell Design," IPCOM000141986D, IP.com Prior Art Database, Oct. 18, 2006, 4 pp.

* cited by examiner

MEMORY CELL DEVICE AND PROGRAMMING METHODS

CROSS-REFERENCE TO RELATED APPLICATIONS

This application claims the benefit of U.S. Provisional Application 60/888,149, filed 5 Feb. 2007, entitled Memory Cell Device Programming Method, which is incorporated by reference herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive or other memory material, like phase change based memory materials, and to methods for programming such devices.

2. Description of Related Art

Chalcogenide materials are widely used in read-write optical disks. These materials have at least two solid phases including a generally amorphous phase and a generally crystalline phase. Laser pulses are used in read-write optical disks to switch between phases and to read the optical properties of the material after the phase change.

Chalcogenide materials also can be caused to change phase by application of electrical current. This property has generated interest in using programmable resistive material to form nonvolatile memory circuits.

In phase change memory, data is stored by causing transitions in an active region of the phase change material between amorphous and crystalline states using current. Current heats the material and causes transitions between the states, and is generally a lower current operation. The change from crystalline to amorphous, referred to as reset herein, is generally a higher current operation.

It has long been recognized that multiple resistive levels can be achieved according to the level of crystallization within a phase change material. See, for example, Ovshinsky, "Method and Apparatus for Storing and Retrieving Information," U.S. Pat. No. 3,530,441, issued Sep. 22, 1970; and Flynn, "Phase Change Data Storage Device for Multi-Level Recording," U.S. Pat. No. 6,899,938, issued May 31, 2005. However, the conventional methods for achieving multi-level programming with phase change memory devices have not been completely successful because the distribution of the resistance values associated with each data value are larger across an array of memory cells than is desirable. That is, the resistance level corresponding to a given data value stored in a memory cell using conventional techniques varies from memory cell to memory cell in an array more than is desirable.

Accordingly, it is desirable to provide a multi-level programming method having a reduced distribution of resistance values associated with each data value.

SUMMARY OF THE INVENTION

A memory device including a memory cell comprising phase change material is described along with methods for programming the memory device.

A method for programming described herein includes determining a data value for the memory cell, and applying a pulse pair to store the data value. The pulse pair includes an initial pulse having a pulse shape adapted to preset the phase change material in the memory cell to a normalizing resistance state, and a subsequent pulse having a pulse shape adapted to set the phase change material from the normalizing resistance state to a resistance corresponding to the determined data value.

A memory device described herein includes a memory cell comprising phase change material, and bias circuitry adapted to apply a bias arrangement to the memory cell for storing a data value. The bias arrangement for storing the data value comprises a pulse pair, the pulse pair including an initial pulse having a pulse shape adapted to preset the phase change material in the memory cell to a normalizing resistance state and a subsequent pulse having a pulse shape adapted to set the phase change material in the memory cell from the normalizing resistance to a resistance corresponding to the data value.

An aspect of the present invention of programming a data value for a memory cell includes applying an initial pulse or a sequence of pulses to cause a transition of the active region of the phase change material into "normalizing" phase, for example a generally amorphous phase. This transition of the active region "normalizes" the condition of the memory cell and helps to make the resulting resistances for each level more uniform, thus tightening the distribution of the resistances for a memory device having an array of memory cells.

Other aspects and advantages of the technology described herein can be understood with reference to the figures and the detailed description which follow.

DETAILED DESCRIPTION

Figure 1:
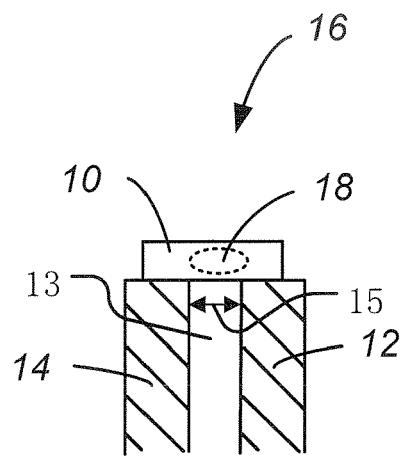
FIGS. 1-5 are simplified cross-sectional views illustrating five example configurations for a memory cell having a programmable phase change material coupled to first and second electrodes.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations of the description that follows. Like elements in various embodiments are commonly referred to with like reference numerals.

A detailed description is provided with reference to FIGS. 1-11.

FIG. 1 is a simplified cross-sectional view illustrating a first configuration for a memory cell 16 having a programmable phase change material 10 coupled to first and second electrodes 12, 14. A dielectric spacer 13 having a width 15 separates the first and second electrodes 12, 14. The memory material 10 extends across the dielectric spacer 13 and contacts the first and second electrodes 12, 14, thereby defining an inter-electrode path between the first and second electrodes 12, 14 having a path length defined by the width 15 of the dielectric spacer 13. In operation, as current passes between the first and second electrodes 12, 14 and through phase change material 10, a portion of the phase change material 10 called the active region 18 heats up more quickly than the remainder of the phase change material 10. One of the design considerations for phase change devices is to minimize the size of active region 18 thereby reducing the power required to reset the phase change material 10. The size and location of active region 18 is determined in part by the insulating properties of the materials (not shown) surrounding the phase change material 10 and the current path between electrodes 12 and 14.

Figure 2:
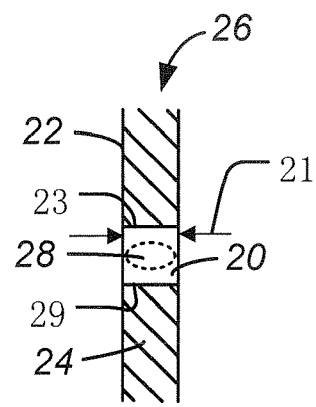

FIG. 2 is a simplified cross-sectional view illustrating a second configuration for a memory cell 26 having a programmable phase change material 20 coupled to first and second electrodes 22, 24. The phase change material 20 has an active region 28 and contacts the first and second electrodes 22, 24 at top and bottom surfaces 23, 29 respectively. The phase change material 20 has a width 21 the same as that of the first and second electrodes 22, 24.

Figure 3:
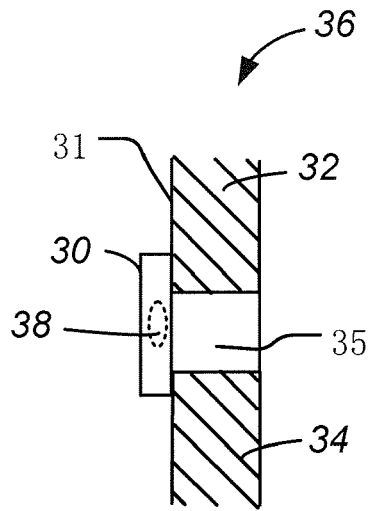

FIG. 3 is a simplified cross-sectional view illustrating a third configuration for a memory cell 36 having a programmable phase change material 30 coupled to first and second electrodes 32, 34, the phase change material 30 having an active region 38. The first and second electrodes 32, 34 are separated by dielectric spacer 35. The first and second electrodes 32, 34 and the dielectric spacer 35 have a sidewall surface 31. The phase change material 30 is on the sidewall surface 31 and extends across the dielectric spacer 35 to contact the first and second electrodes 32, 34.

Figure 4:
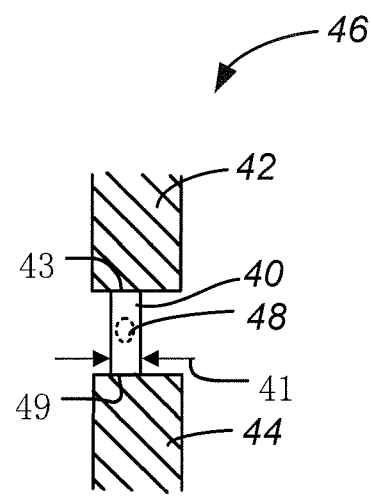

FIG. 4 is a simplified cross-sectional view illustrating a fourth configuration for a memory cell 46 having a programmable phase change material 40 coupled to first and second electrodes 42, 44. The phase change material 40 has an active region 48 and contacts the first and second electrodes 42, 44 at top and bottom surfaces 43, 49 respectively. The phase change material 40 has a width 41 less than that of the first and second electrodes 42, 44.

Figure 5:
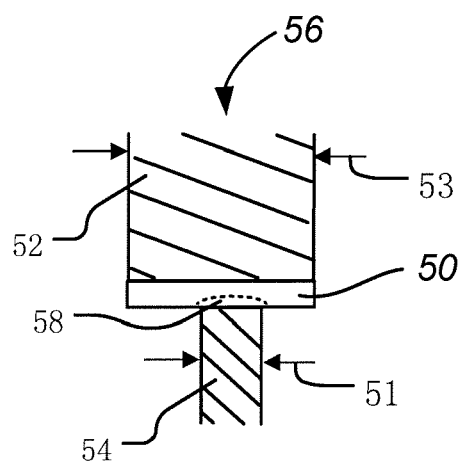

FIG. 5 is a simplified cross-sectional view illustrating a fifth configuration for a memory cell 56 having a programmable phase change material 50 coupled to first and second electrodes 52, 54. The first electrode 54 has a width 51 less than width 53 of the second electrode 52. Because of the difference between width 51 and width 53, in operation the current density in the phase change material 50 is largest in the region adjacent the second electrode 54, resulting in the active region 58 having a "mushroom" shape as shown in the Figure.

It will be understood that the present invention is not limited to the example configurations illustrated in FIGS. 1-5, and additional configurations for memory cells will be apparent to those skilled in the art. For additional information on the manufacture, component materials, use and operation of memory cell devices, in particular phase change random access memory devices, see U.S. patent application Ser. No. 11/155,067, filed 17 Jun. 2005, entitled Thin Film Fuse Phase Change Ram And Manufacturing Method.

The present invention recognizes that it would be desirable to be able to reliably program the active region of memory cells to three or more phases, for example a generally amorphous phase and at least two different crystalline phases, thereby increasing the amount of data that can be stored in a given memory cell and thus increasing the data storage density of a an array of memory cells.

The phase change material of the memory cell is programmable to a plurality of different data values. The different data values (data levels) typically include one value corresponding to a generally amorphous phase for the active region of the phase change material, and the remaining values corresponding to crystalline phases each having different ratios of amorphous to crystalline structure within the active region. In some embodiments, one of the crystalline phases is essentially entirely crystalline so as to maximize the difference in resistance from that of an amorphous phase. Because a crystalline structure of the phase change material has a much lower electrical resistance than an amorphous structure, the data value of memory cell can be determined by the resistance exhibited by the phase change material.

FIGS. 6-9 illustrate a method for programming a memory cell in accordance with an embodiment, the memory cell comprising programmable phase change material capable of being programmed to one of three or more different data values. In the programming method illustrated in FIGS. 6-9 the programmable phase change material is programmed to one of four different resistance values depending upon the determined data value to be stored in the memory cell. However, it will be understood that the scope of the present invention includes programming the phase change material of a memory cell to one of three or more different data values.

Figure 8:
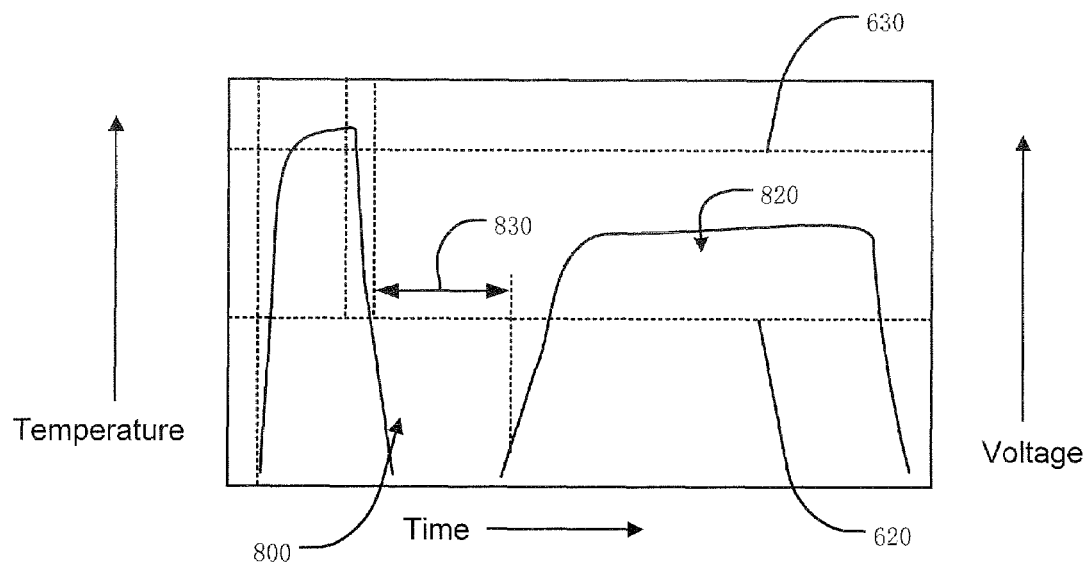
Figure 9:
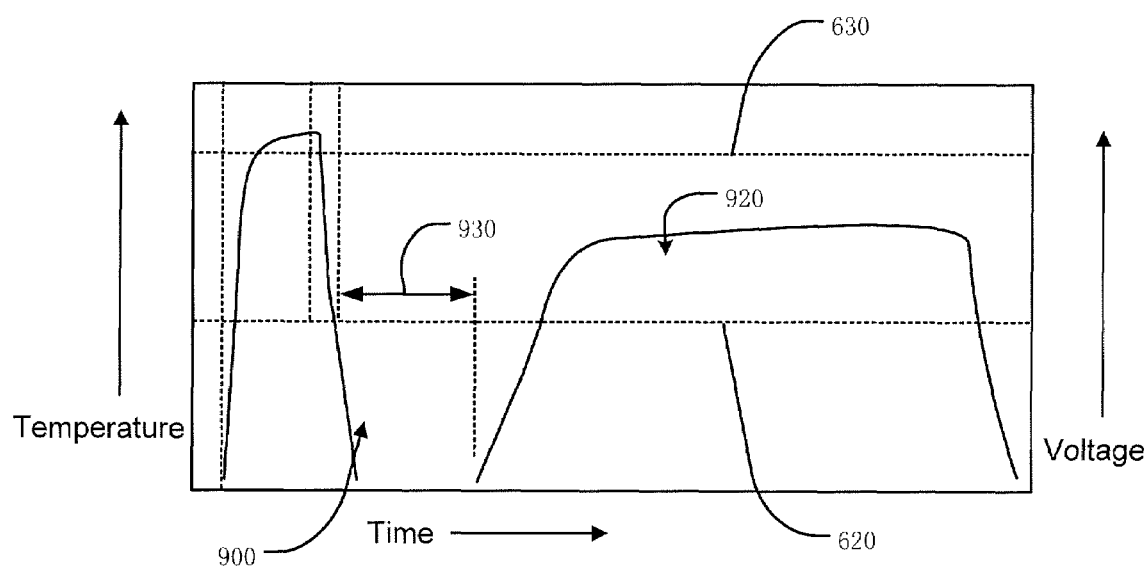
Figure 10:
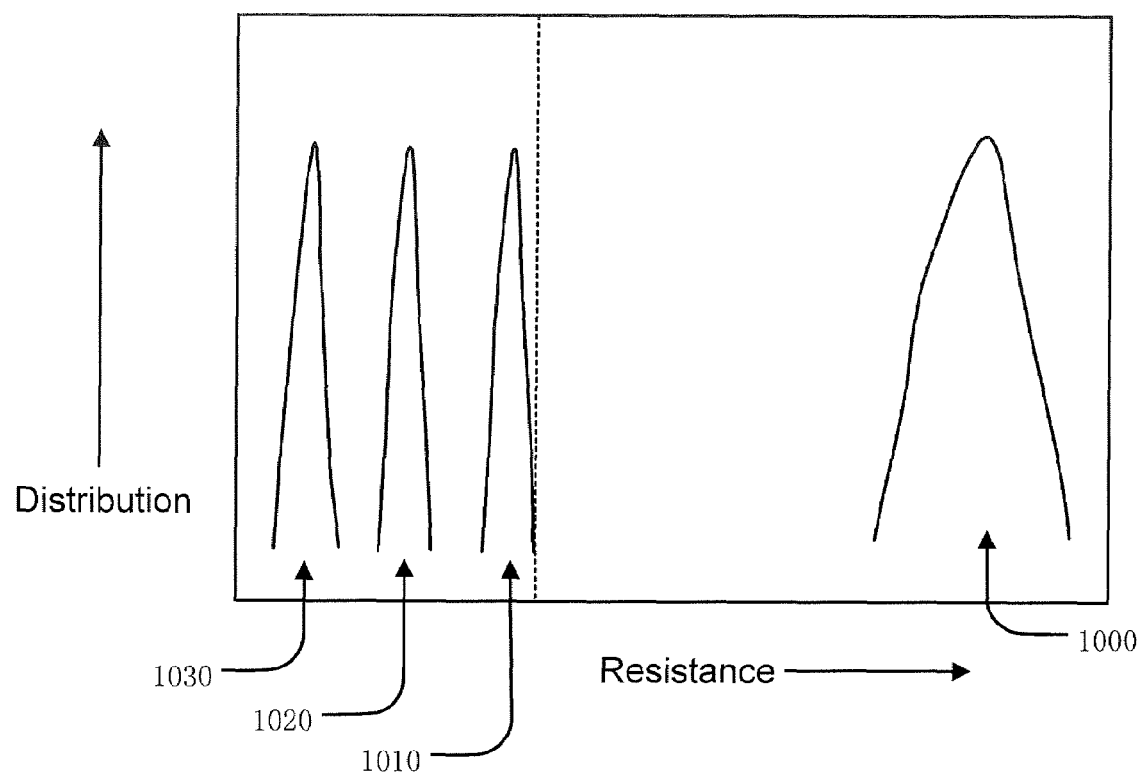
FIG. 10 is a graph illustrating resistance value distribution ranges for the phase change material of a memory cell programmed by the method illustrated in FIGS. 6-9.

FIG. 10 is a graph illustrating resistance states 1000, 1010, 1020, 1030 for the phase change material of the memory cell programmed by the method illustrated in FIGS. 6-9. The resistance states 1000, 1010, 1020, 1030 each have resistance distribution ranges, and each resistance state 1000, 1010, 1020, 1030 corresponds to one of the four data values (two bits) for the memory cell programmed by the method illustrated in FIGS. 6-9. For example, resistance state 1000 can correspond to a memory cell data value of "00", resistance state 1010 can correspond to a data value of "01", resistance state 1020 can correspond to a data value of "10", and resistance state 1030 can correspond to a data value of "11". Alternatively, the resistance states 1000, 1010, 1020, 1030 can correspond to any of the other data values as will be apparent to those skilled in the art. In general, the number of resistance states depends upon the number of values being programmed, each resistance state corresponding to a different data value.

Figure 6:
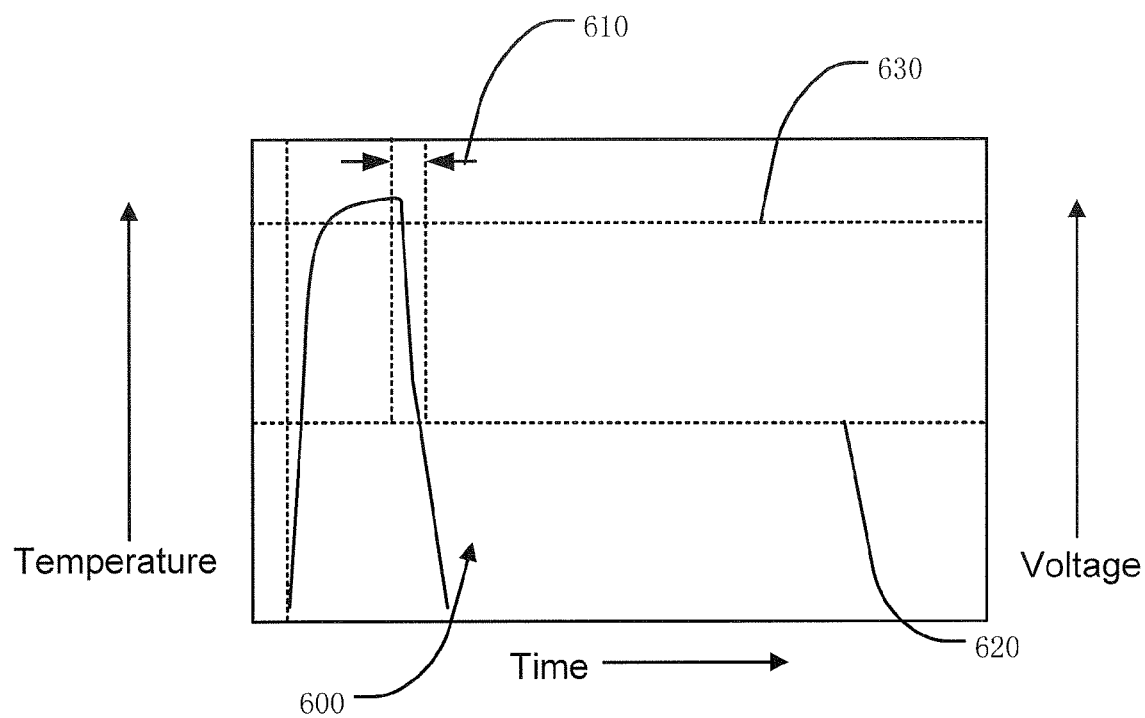
FIGS. 6-9 illustrate a method for programming a memory cell in accordance with an embodiment.

FIG. 6 illustrates programming a first data value to the memory cell if the determined data value is the first data value by applying a reset pulse 600. The reset pulse 600 causes a transition of an active region of the phase change material into an amorphous phase, thereby setting the phase change material to a resistance within the resistive value range of resistance state 1000 of FIG. 10. The reset pulse 600 is a relatively high energy pulse, sufficient to raise the temperature of at least the active region above the transition (crystallization) temperature 620 of the phase change material and also above the melting temperature 630 to place at least the active region in a liquid state. The reset pulse 600 being for example, between about 1 ns to about 50 ns long, and as another example being between about 20 ns and about 500 ns. In some embodiments the reset pulse results in a voltage difference of between about 2V and about 5V across the phase change material of the memory cell. The reset pulse is then terminated, resulting in a relatively quick quenching time 610 as the active region quickly cools to below transition temperature 620 so that the active region stabilizes to an amorphous phase. Quenching time 610 is typically less than about 10 ns and preferably less than about 1 ns.

The programming of the first data value can also be accomplished using more than one pulse, for example using a pair of pulses. Using a pair of pulses for the programming of the first data value can be desirable for timing purposes when the programming of the other data values also use a pair of pulses, for example like those illustrated in FIGS. 7-9.

Figure 7:
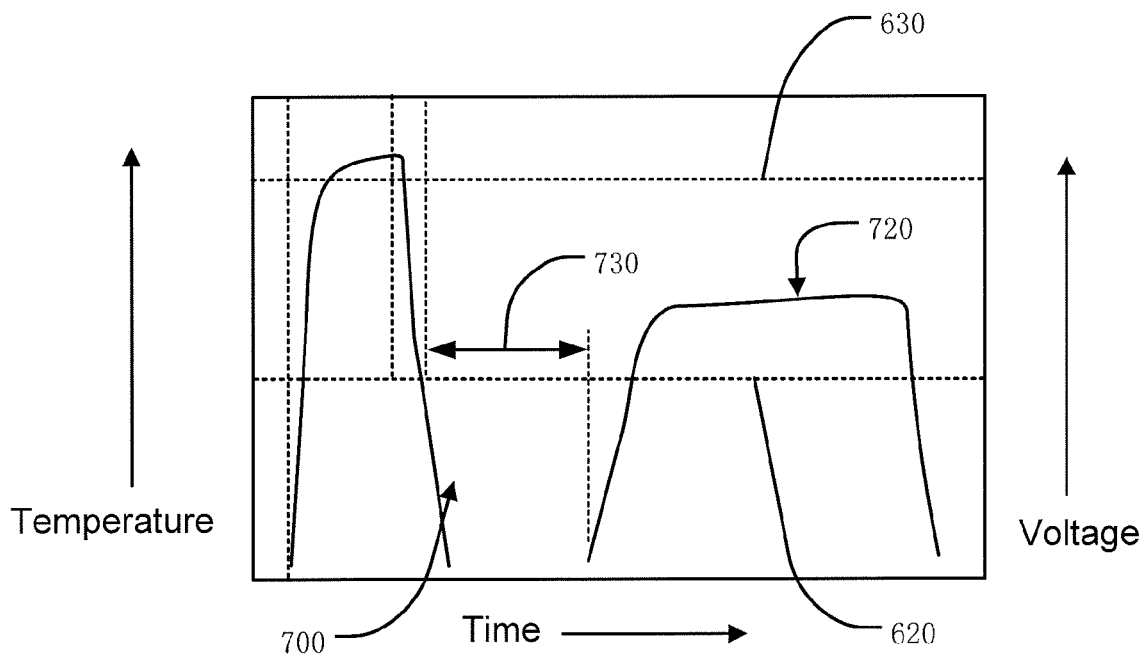

FIG. 7 illustrates programming a second data value to the memory cell if the determined data value is the second data value by applying a pulse pair comprising applying a pulse 700 and applying a pulse 720. Applying the pulse 700 causes a transition of the active region into an amorphous phase to normalize the phase change material to resistance state 1000 of FIG. 10, and applying the pulse 720 causes a transition of a first portion of the active region into a crystalline phase, thereby setting the phase change material to a resistance within the resistive value distribution range of resistance state 1010 of FIG. 10. Preferably pulse 700 is similar to reset pulse 600.

The pulse 720 is sufficient to raise the temperature of the first portion of the active region above transition temperature 620 such that the first portion transitions into the crystalline phase. The length of time 730 between the completion of the quenching and the beginning of the pulse 720 is preferably small so that the memory cell 16 can be quickly programmed, the time 730 typically being at least about 5 ns, and preferably at least about 1 ns.

FIG. 8 illustrates programming a third data value to the memory cell 16 if the determined data value is the third data value by applying a sequence of pulses comprising applying a pulse 800 and applying a pulse 820. Applying the pulse 800 causes a transition of the active region 18 into an amorphous phase to normalize the phase change material to resistance state 1000 of FIG. 10, and applying the pulse 820 causes a transition of a second portion of the active region 18 into a crystalline phase, thereby setting the phase change material 10 to a resistance within the resistive value distribution range of resistance state 1020 of FIG. 10. Preferably pulse 800 is similar to reset pulse 600.

In the illustrated embodiment the pulse 820 has a pulse length of time larger than that of the pulse 720 of FIG. 7, and is sufficient to raise the temperature of the second portion of the active region 18 above transition temperature 620 such that the second portion transitions into the crystalline phase. The larger pulse length results in the second portion of the phase change material that transitions into the crystalline phase being greater than the first portion, thus lowering the resistance of the phase change material of the memory cell to the resistance state 1020 of FIG. 10. The length of time 830 between the completion of the quenching and the beginning of the pulse 820 is preferably small, and in some embodiments is equal to that of the time 730 of FIG. 7.

FIG. 9 illustrates programming a fourth data value to the memory cell 16 if the determined data value is the fourth data value by applying a sequence of pulses comprising applying a pulse 900 and applying a pulse 920. Applying the pulse 900 causes a transition of the active region 18 into an amorphous phase to normalize the phase change material to resistance state 1000 of FIG. 10, and applying the pulse 920 causes a transition of a third portion of the active region 18 into a crystalline phase, thereby setting the phase change material 10 to a resistance within the resistive value distribution range of resistance state 1030 of FIG. 10. Preferable pulse 900 is similar to reset pulse 600.

In the illustrated embodiment the pulse 920 has a pulse length of time larger than that of the pulse 820 of FIG. 8, and is sufficient to raise the temperature of the third portion of the active region 18 above transition temperature 620 such that the third portion transitions into the crystalline phase. The larger pulse length results in the third portion of the phase change material that transitions into the crystalline phase being greater than the second portion, thus lowering the resistance of the phase change material to resistance state 1030 of FIG. 10. The length of time 930 between the completion of the quenching and the beginning of the pulse 920 is preferably small, and in some embodiments is equal to that of the time 730 of FIG. 7.

As mentioned above, the scope of the present invention includes programming the phase change material of a memory cell to one of three or more different data values. In the present invention, programming a data value to a memory cell includes applying a first pulse or a sequence of pulses to cause a transition of the active region of the phase change material into a "normalizing" phase, for example a generally amorphous phase which changes the pre-existing state of the memory cell into a known condition that is consistent in advance of the second pulse in the pulse pair. The second pulse therefore affects the memory cell in the same way, independent of its previous state. This transition of the active region "normalizes" the condition of the memory cell and helps to make the resulting resistances for each value more uniform, thus tightening the distribution of the resistances of the an array of memory cells.

In the embodiment illustrated in FIGS. 6-9, the presetting of a memory cell is accomplished with a single pulse that places that places an active region into a generally amorphous phase. Alternatively, the normalizing phase can be other than amorphous, including being generally crystalline. Additionally, the presetting of a memory cell can be accomplished using more than one pulse, for example using a pair of pulses.

Embodiments of memory cell 16 include phase change based memory materials, including chalcogenide based materials and other materials, for memory material 10. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon oxygen, silicon dioxide, silicon nitride, copper, silver, gold, aluminum, aluminum oxide, tantalum, tantalum oxide, tantalum oxide, tantalum nitride, titanium and titanium oxide. See, for example U.S. Pat. No. 6,800,504, and U.S. Patent Application Publication No. US 2005/0029502.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Chalcogenide materials include $Ge_xSb_yTe_z$ where x:y:z=2:2:5, or other compositions with x: 0~5; y: 0~5; z: 0~10. GeSbTe with doping, such as N—, Si—, Ti—, or other element doping may also be used.

GeSbTe may be formed by PVD sputtering or magnetron-sputtering method with reactive gases of Ar, $N_2$, and/or He, etc at the pressure of 1 mtorr~100 mtorr. The deposition is usually done at room temperature. The collimater with aspect ratio of 1~5 can be used to improve the fill-in performance. To improve the fill-in performance, the DC bias of several ten to several hundred volts is also used. On the other hand, the combination of DC bias and the collimater can be used simultaneously.

The post deposition annealing treatment with vacuum or $N_2$ ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

Figure 11:
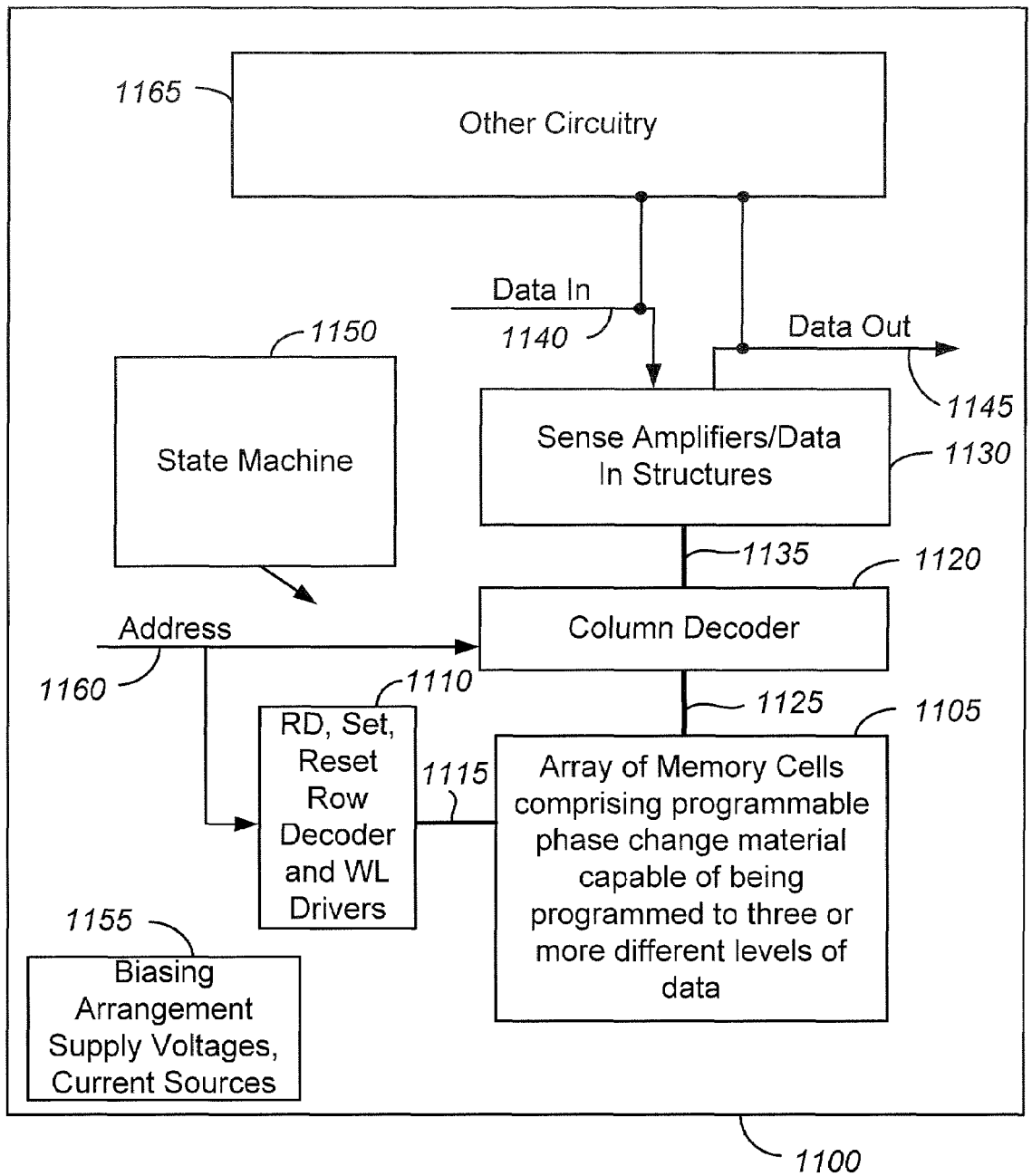
FIG. 11 is a simplified block diagram of an integrated circuit in accordance with an embodiment.

FIG. 11 is a simplified block diagram of an integrated circuit in accordance with an embodiment. The integrated circuit 1100 includes a memory array 1105 implemented using memory cells as described herein comprising programmable phase change material capable of being programmed to three or more different data values. A row decoder 1110 having read, set and reset modes is coupled to a plurality of word lines 1115 arranged along rows in the memory array 1105. A column decoder 1120 is coupled to a plurality of bit lines 1125 arranged along columns in the memory array 1105 for reading, setting and resetting memory cells in the memory array 1105. Addresses are supplied on bus 1160 to column decoder 1120 and row decoder 1110. Sense amplifiers and data-in structures in block 1130, including current sources for the read, set and reset modes, are coupled to the column decoder 1120 via data bus 1135. Data is supplied via the data-in line 1140 from input/output ports on the integrated circuit 1100 or from other data sources internal or external to the integrated circuit 1100, to the data-in structures in block 1130. In the illustrated embodiment, other circuitry 1165 is included on the integrated circuit 1100, such as a general purpose processor or special purpose application circuitry, or a combination of modules providing system-on-a-chip functionality supported by the phase change memory cell array. Data is supplied via the data-out line 1145 from the sense amplifiers in block 1130 to input/output ports on the integrated circuit 1100, or to other data destinations internal or external to the integrated circuit 1100.

A controller implemented in this example using bias arrangement state machine 1150 controls the application of bias arrangement supply voltages and current sources 1155, such as read, program pulse pairs and verify pulses described herein, comprising voltages and/or currents for the word lines and bit lines, and controls the word line/source line operation using an access control process. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

Any and all patents, patent applications and printed publications referred to above are incorporated by reference.

What is claimed is:

1. A method for programming a memory cell comprising phase change material, the method comprising:
   determining a data value for the memory cell; and
   applying a pulse pair to store the data value, the pulse pair including an initial normalizing pulse having a pulse shape adapted to preset the phase change material in the memory cell to a normalizing resistance state and a subsequent pulse having a pulse shape adapted to set the phase change material in the memory cell from the normalizing resistance state to a resistance corresponding to the determined data value.

2. The method of claim 1, wherein the memory cell is adapted for storing 2 bits, and including applying a first pulse pair if the determined data value is 00, a second pulse pair if the determined data value is 01, a third pulse pair if the determined data value is 10, and a fourth pulse pair if the determined data value is 11.

3. The method of claim 1, including:
   applying a first pulse pair if the determined data value is a first data value, the first pulse pair comprising a first pulse having a pulse shape adapted to preset the phase change material to the normalizing resistance state, and a second pulse having a pulse shape adapted to set the phase change material from the normalizing resistance state to a resistance corresponding to the first data value; and
   applying a second pulse pair if the determined data value is a second data value, the second pulse pair comprising a third pulse having a pulse shape adapted to preset the phase change material to the normalizing resistance state, and a fourth pulse having a pulse shape adapted to set the phase change material from the normalizing resistance state to a resistance corresponding to the second data value, wherein the pulse shape of the third pulse is similar to the pulse shape of the first pulse.

4. The method of claim 3, wherein the fourth pulse has a pulse length of time larger than that of the second pulse.

5. The method of claim 3, wherein the second pulse is applied at least about 5 ns after the first pulse presets the phase change material to the normalizing resistance state.

6. The method of claim 3, wherein the second pulse is applied at least about 1 ns after the first pulse presets the phase change material to the normalizing resistance state.

7. A method for programming a memory cell comprising phase change material, the method comprising:
   determining a data value for the memory cell;
   applying a reset pulse if the determined data value is a first data value, the reset pulse having a pulse shape adapted to cause a transition of an active region into an amorphous phase, thereby setting the phase change material to a resistance corresponding to the first data value;
   applying a first pulse pair if the determined data value is a second data value, the first pulse pair comprising a first pulse having a pulse shaped adapted to cause a transition of the active region into an amorphous phase, and a second pulse having a pulse shape adapted to cause of transition of a portion of the active region into a crystalline phase, thereby setting the phase change material to a resistance corresponding to the second data value; and
   applying a second pulse pair if the determined data value is a third data value, the second pulse pair comprising a third pulse having a pulse shape adapted to cause a transition of the active region into an amorphous phase, and a fourth pulse having a pulse shape adapted to cause a transition of a portion of the active region into a crystalline phase, thereby setting the phase change material to a resistance corresponding to the third data value.

8. A memory device comprising:
   a memory cell comprising phase change material; and
   bias circuitry adapted to apply a bias arrangement to the memory cell for storing a data value;
   wherein the bias arrangement for storing the data value comprises a pulse pair, the pulse pair including an initial pulse having a pulse shape adapted to preset the phase change material in the memory cell to a normalizing resistance state and a subsequent pulse having a pulse shape adapted to set the phase change material in the memory cell from the normalizing resistance state to a resistance corresponding to the data value.

9. The memory device of claim 8, wherein the memory cell is adapted for storing 2 bits, and including the bias arrangement comprising a first pulse pair if the data value is 00, the bias arrangement comprising a second pulse pair if the data value is 01, the bias arrangement comprising a third pulse pair if the data value is 10, and the bias arrangement comprising a fourth pulse pair if the data value is 11.

10. The memory device of claim 8, including:
    the bias arrangement comprising a first pulse pair if the data value is a first data value, the first pulse pair comprising a first pulse having a pulse shape adapted to preset the phase change material to the normalizing resistance state, and a second pulse having a pulse shape adapted to set the phase change material from the normalizing resistance state to a resistance corresponding to the first data value; and
    the bias arrangement comprising a second pulse pair if the data value is a second data value, the second pulse pair comprising a third pulse having a pulse shape adapted to preset the phase change material to the normalizing resistance state, and a fourth pulse having a pulse shape adapted to set the phase change material from the normalizing resistance state to a resistance corresponding to the second data value, wherein the pulse shape of the third pulse is similar to the pulse shape of the first pulse.

11. The device of claim 10, wherein the fourth pulse has a pulse length of time larger than that of the second pulse.

12. The device of claim 10, wherein the second pulse is applied at least about 5 ns after the first pulse presets the phase change material to the normalizing resistance state.

13. The device of claim 10, wherein the second pulse is applied at least about 1 ns after the first pulse presets the phase change material to the normalizing resistance state.

14. A memory device comprising:
    a memory cell comprising phase change material; and
    bias circuitry adapted to apply a bias arrangement to the memory cell for storing a data value;
    wherein the bias arrangement comprises a reset pulse if the data value is a first data value, the reset pulse having a pulse shape adapted to cause a transition of an active region into an amorphous phase, thereby setting the phase change material to a resistance corresponding to the first data value;
    wherein the bias arrangement comprises a first pulse pair if the data value is a second data value, the first pulse pair comprising a first pulse having a pulse shaped adapted to cause a transition of the active region into an amorphous phase, a second pulse having a pulse shape adapted to cause a transition of a portion of the active region into a crystalline phase, thereby setting the phase change material to a resistance corresponding to the second data value;

wherein the bias arrangement comprises a second pulse pair if the data value is a third data value, the second pulse pair comprising a third pulse having a pulse shape adapted to cause a transition of the active region into an amorphous phase, and a fourth pulse having a pulse shape adapted to cause a transition of a portion of the active region into a crystalline phase, thereby setting the phase change material to a resistance corresponding to the third data value.

\* \* \* \* \*